(12) United States Patent
Middlebrooks

(10) Patent No.: US 8,947,642 B2
(45) Date of Patent: Feb. 3, 2015

(54) METHOD AND APPARATUS FOR ESTIMATING MODEL PARAMETERS OF AND CONTROLLING A LITHOGRAPHIC APPARATUS BY MEASURING A SUBSTRATE PROPERTY AND USING A POLYNOMIAL MODEL

(75) Inventor: Scott Anderson Middlebrooks, Duizel (NL)

(73) Assignee: ASML Netherlands B.V., Veldhoven (NL)

( * ) Notice: Subject to any disclaimer, the term of this patent is extended or adjusted under 35 U.S.C. 154(b) by 678 days.

(21) Appl. No.: 13/010,402

(22) Filed: Jan. 20, 2011

(65) Prior Publication Data

US 2011/0199596 A1 Aug. 18, 2011

Related U.S. Application Data

(60) Provisional application No. 61/305,332, filed on Feb. 17, 2010.

(51) Int. Cl.
*G03B 27/32* (2006.01)
*G03F 7/20* (2006.01)
(52) U.S. Cl.
CPC ............ *G03F 7/70633* (2013.01); *G03F 7/705* (2013.01); *G03F 7/70616* (2013.01)
USPC ........................................................ 355/77
(58) Field of Classification Search
CPC .. G03F 7/705; G03F 7/70616; G03F 7/70633
USPC .................................................... 355/77, 53
See application file for complete search history.

(56) References Cited

U.S. PATENT DOCUMENTS

2011/0010000 A1 1/2011 Mos et al.

FOREIGN PATENT DOCUMENTS

| EP | 1 628 164 A2 | 2/2006 |
|---|---|---|
| KR | 10-2004-0093528 A | 6/2004 |
| WO | WO 2010/006935 A2 | 1/2010 |

OTHER PUBLICATIONS

Korean Patent Publication No. 10-2004-0093528 A, issued Nov. 6, 2004 from the Republic of Korea Intellectual Property Office (machine translation); 6 pages.
International Search Report and Written Opinion of the International Searching Authority directed to related International Application No. PCT/EP2011/050631, European Patent Office, Rijswijk, Netherlands, mailed May 19, 2011; 10 pages.
Mukundan, R., "Some Computational Aspects of Discrete Orthonormal Moments," IEEE Transactions on Image Processing, vol. 13, No. 8, Aug. 2004; pp. 1055-1059.

*Primary Examiner* — Chia-how Michael Liu
(74) *Attorney, Agent, or Firm* — Sterne, Kessler, Goldstein & Fox P.L.L.C.

(57) ABSTRACT

System and methods estimate model parameters of a lithographic apparatus and control lithographic processing by a lithographic apparatus. An exposure is performed using a lithographic apparatus across a wafer. A set of predetermined wafer measurement locations is obtained. Discrete orthonormal polynomials are generated using the predetermined substrate measurement locations. The overlay errors arising from the exposure are measured at the predetermined locations to obtain overlay measurements. The estimated model parameters of the lithographic apparatus are calculated from the overlay measurements by using the discrete orthogonal polynomials as a basis function to model the overlay across the wafer. Finally, the estimated model parameters are used to control the lithographic apparatus in order to provide corrected overlay across the wafer.

17 Claims, 4 Drawing Sheets

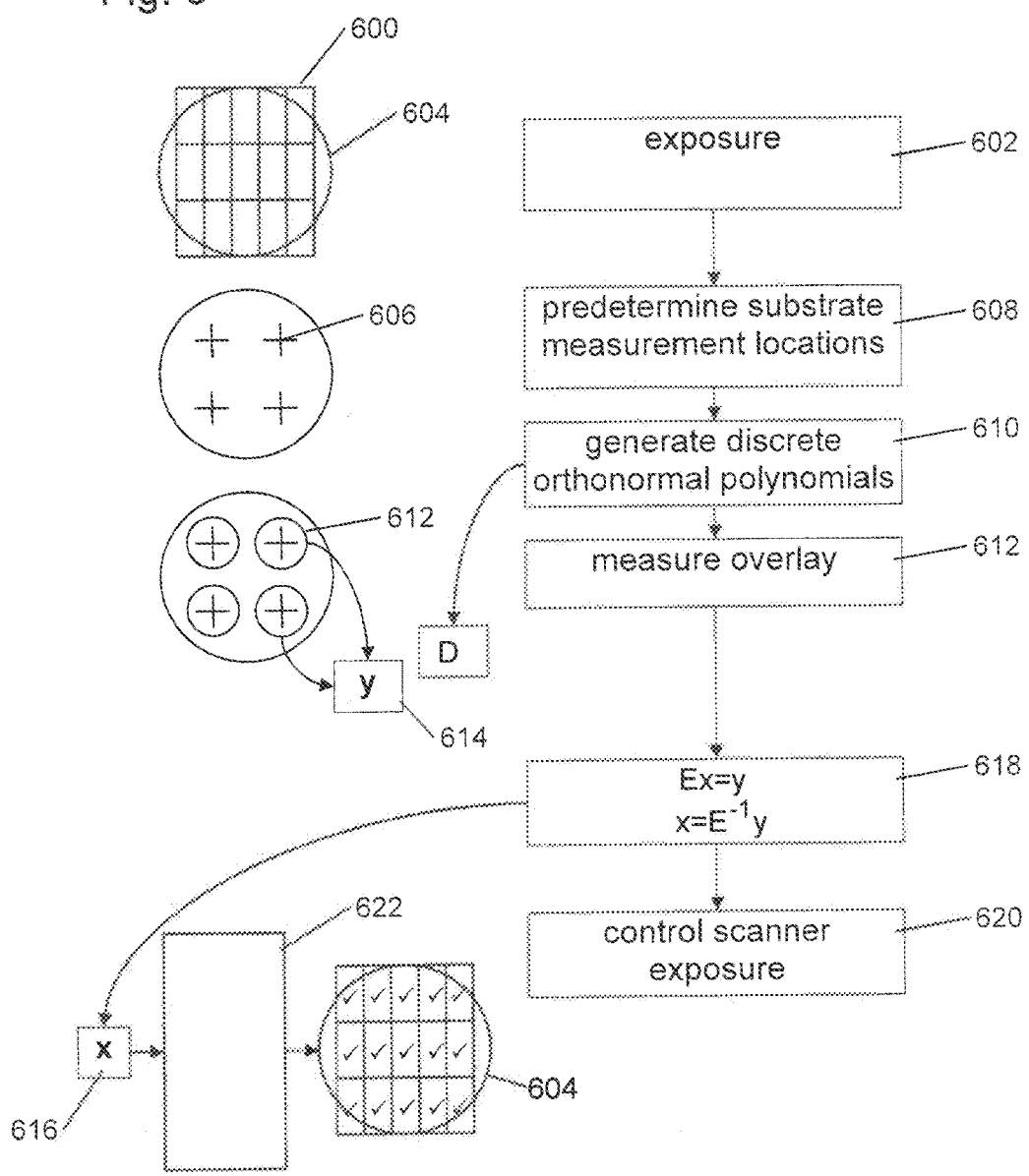

METHOD AND APPARATUS FOR ESTIMATING MODEL PARAMETERS OF AND CONTROLLING A LITHOGRAPHIC APPARATUS BY MEASURING A SUBSTRATE PROPERTY AND USING A POLYNOMIAL MODEL

CROSS REFERENCE TO RELATED APPLICATIONS

This applications claims benefit under 35 U.S.C. §119(e) to U.S. Provisional Application No. 61/305,332, filed Feb. 17, 2010, which is incorporated by reference herein in its entirety.

FIELD

The present invention relates to estimating model parameters of and controlling lithographic apparatus usable, for example, in the manufacture of devices by lithographic techniques.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In order to monitor the lithographic process, parameters of the patterned substrate are measured. Parameters may include, for example, the overlay error between successive layers formed in or on the patterned substrate and critical linewidth of developed photosensitive resist. This measurement may be performed on a product substrate and/or on a dedicated metrology target. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

Typically, properties of the substrate such as overlay errors are measured across the exposure field and across the wafer substrate. Overlay errors are not controlled at each and every measurement point. Rather, a parameterization is used to characterize overlay across the field and wafer.

This parameterization describes the overlay errors as a function of wafer and field position. This parameterization can be simple, such as a 10-parameter model, or more complex, such as a basis set of high order polynomials. Using this parameterization, the corrections can be calculated that should be applied at the lithography apparatus with the aim of driving overlay errors across the wafer (field) to zero.

The precision of the calculated control move is a function of the variance of the measurements and the model. The model is determined by where measurements are performed, so the precision of the control move is ultimately a function of the variance of the measurements, the model, and where measurements are performed.

If the basis function that defines the model is non-orthogonal across the wafer (field) domain, there will then be linear dependence between the parameters, which makes the system non-unique and the parameters harder to estimate. As a result, control precision is adversely impacted.

SUMMARY

It is desirable to provide a system that overcomes these problems.

According to a first aspect of the invention, there is provided a method of estimating model parameters of a lithographic apparatus, the method comprising the steps: performing a lithographic process using the lithographic apparatus across a substrate, using predetermined substrate measurement locations to generate discrete orthogonal polynomials, measuring a substrate property arising from the lithographic process at locations of the substrate corresponding to the predetermined measurement locations to obtain substrate property measurements (y), and calculating, estimated model parameters (x) of the lithographic apparatus from the substrate property measurements (y) by using the generated discrete orthogonal polynomials as a basis function to model (D) the substrate property across the substrate.

According to a second aspect of the invention, there is provided a method of controlling lithographic processing by a lithographic apparatus, the method comprising the steps: performing a lithographic process using the lithographic apparatus across a substrate, using predetermined substrate measurement locations to generate discrete orthogonal polynomials, measuring a substrate property arising from the lithographic process at locations of the substrate corresponding to the predetermined measurement locations to obtain substrate property measurements (y), calculating estimated model parameters (x) of the lithographic apparatus from the substrate property measurements (y) by using the generated discrete orthogonal polynomials as a basis function to model (D) the substrate property across the substrate, and controlling lithographic processing by the lithographic apparatus using the estimated model parameters.

According to a third aspect of the invention, there is provided an apparatus for estimating model parameters of a lithographic apparatus used to perform a lithographic process across a substrate, the apparatus comprising a processor configured to: use predetermined substrate measurement locations to generate discrete orthogonal polynomials, receive substrate property measurements (y) arising from the lithographic process measured at locations of the substrate corresponding to the predetermined measurement locations, and calculate estimated model parameters (x) of the lithographic apparatus from the substrate property measurements (y) by using the generated discrete orthogonal polynomials as a basis function to model (D) the substrate property across the substrate.

According to a fourth aspect of the invention, there is provided an apparatus for controlling lithographic processing by a lithographic apparatus used to perform a lithographic process across a substrate, the apparatus comprising a processor configured to: use predetermined substrate measurement locations to generate discrete orthogonal polynomials, receive substrate property measurements (y) arising from the lithographic process measured at locations of the substrate corresponding to the predetermined measurement locations, calculate estimated model parameters (x) of the lithographic apparatus from the substrate property measurements (y) by using the generated discrete orthogonal polynomials as a basis function to model (D) the substrate property across the substrate, and control lithographic processing by the lithographic apparatus using the estimated model parameters.

According to a fifth aspect of the invention, there is provided a computer program product containing one or more sequences of machine-readable instructions for estimating model parameters of a lithographic apparatus used to perform a lithographic process across a substrate, the instructions being adapted to cause one or more processors to: use predetermined substrate measurement locations to generate discrete orthogonal polynomials, receive substrate property measurements (y) arising from the lithographic process measured at locations of the substrate corresponding to the predetermined measurement locations, and calculate estimated model parameters (x) of the lithographic apparatus from the substrate property measurements (y) by using the generated discrete orthogonal polynomials as a basis function to model (D) the substrate property across the substrate.

According to a sixth aspect of the invention, there is provided a computer program product containing one or more sequences of machine-readable instructions for controlling lithographic processing by a lithographic apparatus used to perform a lithographic process across a substrate, the instructions being adapted to cause one or more processors to: use predetermined substrate measurement locations to generate discrete orthogonal polynomials, receive substrate property measurements (y) arising from the lithographic process measured at locations of the substrate corresponding to the predetermined measurement locations, calculate estimated model parameters (x) of the lithographic apparatus from the substrate property measurements (y) by using the generated discrete orthogonal polynomials as a basis function to model (C) the substrate property across the substrate, and control lithographic processing by the lithographic apparatus using the estimated model parameters.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIG. 6 is a flow chart illustrating a method according to an embodiment of the present invention.

Figure 1:
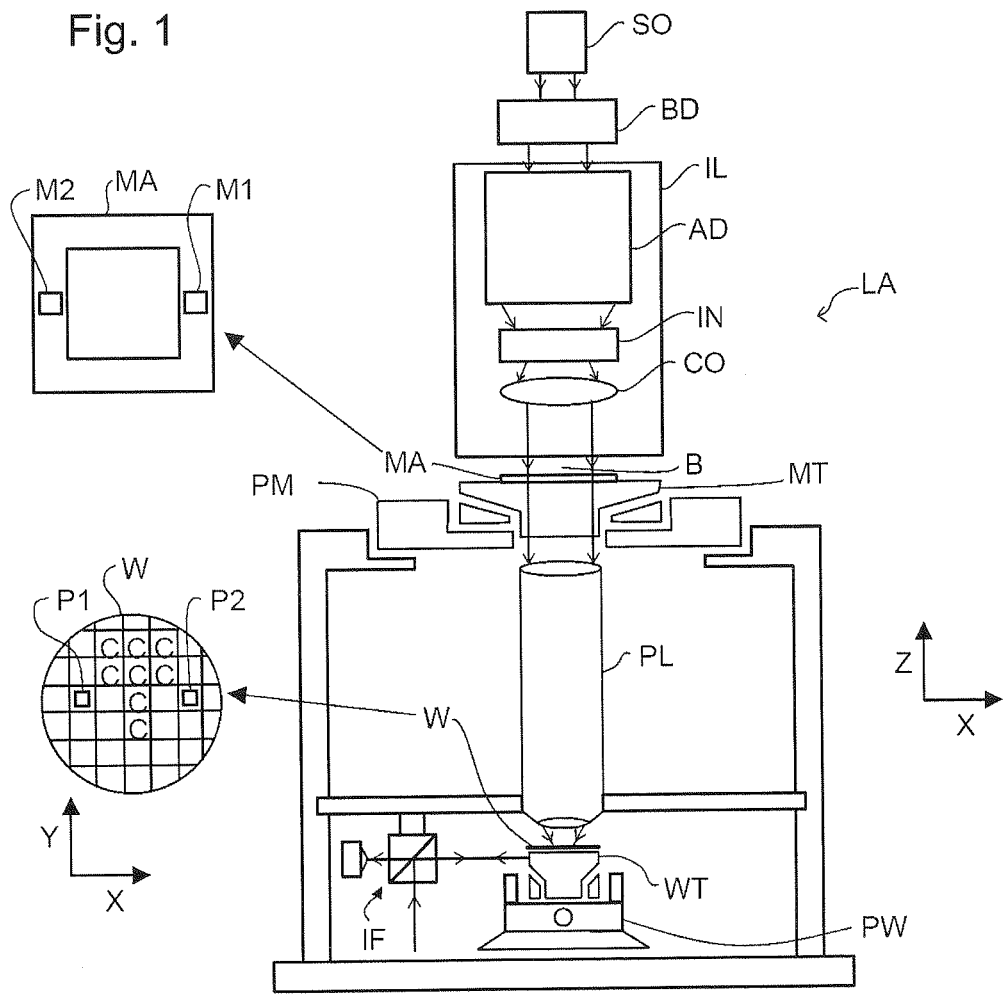
FIG. 1 depicts a lithographic apparatus.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

FIG. 1 schematically depicts a lithographic apparatus. The apparatus comprises an illumination system (illuminator) IL configured to condition a radiation beam B (e.g., UV radiation or DUV radiation), a support structure (e.g., a mask table) MT constructed to support a patterning device (e.g., a mask) MA and connected to a first positioner PM configured to accurately position the patterning device in accordance with certain parameters, a substrate table (e.g., a wafer table) WT constructed to hold a substrate (e.g., a resist coated wafer) W and connected to a second positioner PW configured to accurately position the substrate in accordance with certain parameters, and a projection system (e.g., a refractive projection lens system) PL configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system. BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as a-outer and a-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
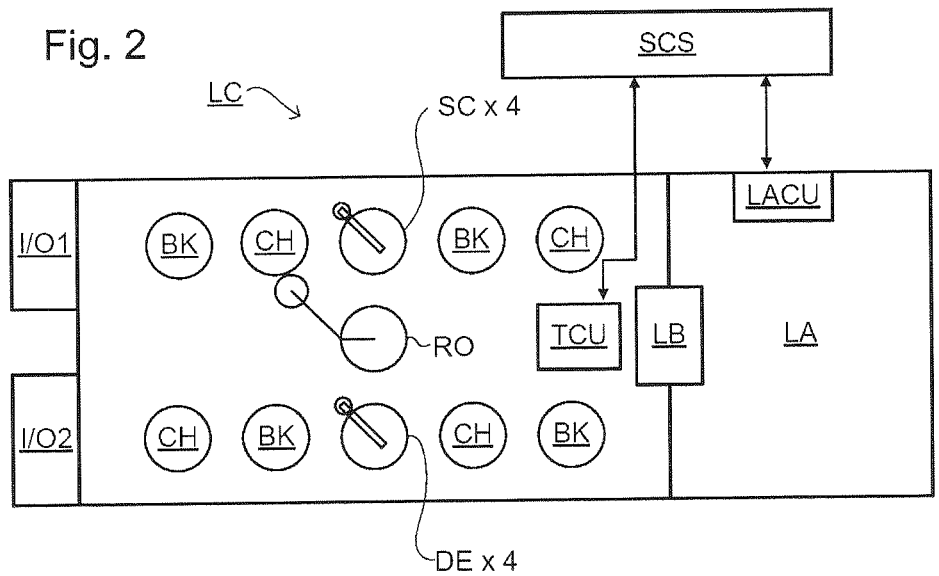
FIG. 2 depicts a lithographic cell or cluster.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough that other substrates of the same batch are still to be exposed. Also, already exposed substrates may be stripped and reworked—to improve yield—or discarded, thereby avoiding performing exposures on substrates that are known to be faulty. In a case where only some target portions of a substrate are faulty, further exposures can be performed only on those target portions which are good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 3:
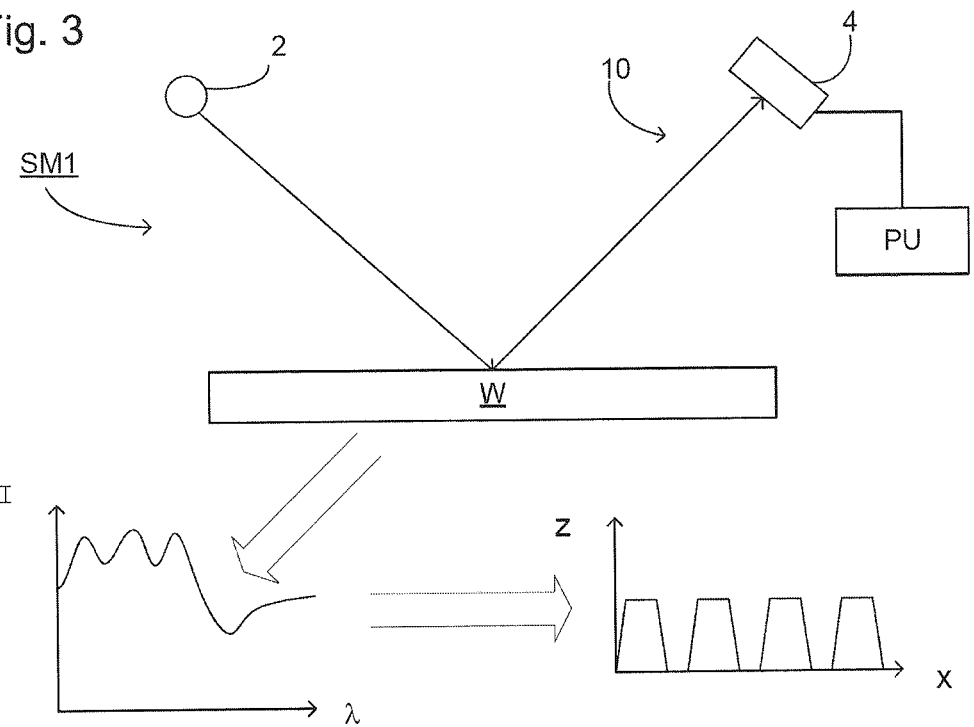
FIG. 3 depicts a first scatterometer.

FIG. 3 depicts a scatterometer which may be used in embodiments of the present invention. It comprises a broadband (white light) radiation projector 2 which projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconstructed by processing unit PU, e.g., by Rigorous Coupled Wave Analysis and non-linear regression or by comparison with a library of simulated spectra as shown at the bottom of FIG. 3. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 4:
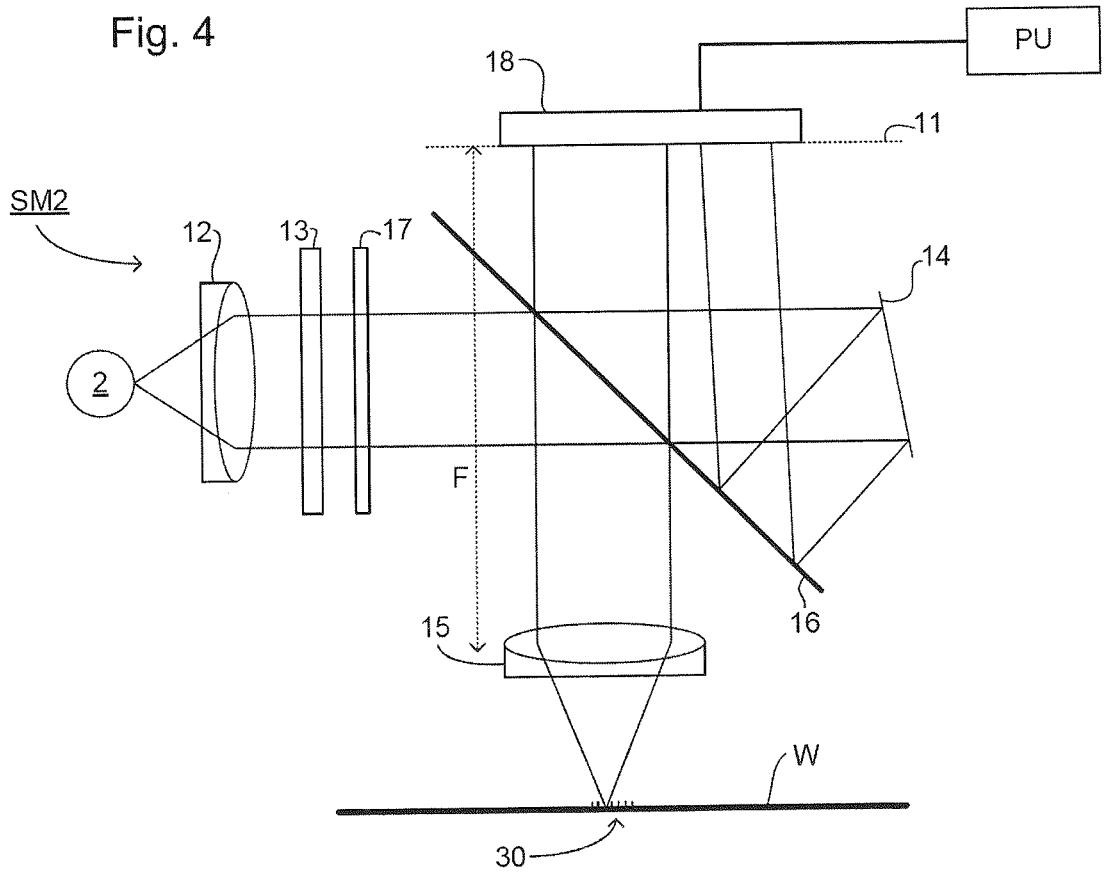
FIG. 4 depicts a second scatterometer.

Another scatterometer that may be used with embodiments of the present invention is shown in FIG. 4. In this device, the radiation emitted by radiation source 2 is collimated using lens system 12 and transmitted through interference filter 13 and polarizer 17, reflected by partially reflected surface 16 and is focused onto substrate W via a microscope objective lens 15, which has a high numerical aperture (NA), preferably at least 0.9 and more preferably at least 0.95. Immersion scatterometers may even have lenses with numerical apertures over 1. The reflected radiation then transmits through partially reflecting surface 16 into a detector 18 in order to have the scatter spectrum detected. The detector may be located in the back-projected pupil plane 11, which is at the focal length of the lens system 15, however the pupil plane may instead be re-imaged with auxiliary optics (not shown) onto the detector. The pupil plane is the plane in which the radial position of radiation defines the angle of incidence and the angular position defines azimuth angle of the radiation. The detector is preferably a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam is often used for example to measure the intensity of the incident radiation. To do this, when the radiation beam is incident on the beam splitter 16 part of it is transmitted through the beam splitter as a reference beam towards a reference mirror 14. The reference beam is then projected onto a different part of the same detector 18 or alternatively on to a different detector (not shown).

A set of interference filters 13 is available to select a wavelength of interest in the range of, say, 405-790 nm or even lower, such as 200-300 nm. The interference filter may be tunable rather than comprising a set of different filters. A grating could be used instead of interference filters.

The detector 18 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic- and transverse electric-polarized light.

Using a broadband light source (i.e., one with a wide range of light frequencies or wavelengths—and therefore of colors) is possible, which gives a large etendue, allowing the mixing of multiple wavelengths. The plurality of wavelengths in the broadband preferably each has a bandwidth of $\Delta\lambda$, and a spacing of at least 2 $\Delta\lambda$, (i.e., twice the bandwidth). Several "sources" of radiation can be different portions of an extended radiation source which have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in EP1,628,164A, which is incorporated by reference herein in its entirety.

The target 30 on substrate W may be a 1-D grating, which is printed such that after development, the bars are formed of solid resist lines. The target 30 may be a 2-D grating, which is printed such that after development, the grating is formed of solid resist pillars or vias in the resist. The bars, pillars or vias may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the 1-D grating, such as line widths and shapes, or parameters of the 2-D grating, such as pillar or via widths or lengths or shapes, may be input to the reconstruction process, performed by processing unit PU, from knowledge of the printing step and/or other scatterometry processes.

A key component of accurate lithography is an increased ability to control lithography scanners and scanning functionality (When referring to "scanners" it should be appreciated that this encompasses all the scan modes and functionality described herein, and other scanning functionalities). Improvements to the scanner's focus and overlay (layer-to-layer alignment) uniformity have recently been achieved by the applicant's Baseliner™ scanner stability module, leading to an optimized process window for a given feature size and chip application, enabling the continuation the creation of smaller, more advanced chips.

When a lithography system is first installed, it must be calibrated to ensure optimal operation. However, over time, system performance parameters will drift. A small amount of drift can be tolerated, but too much drift and the system will go out of specification. Consequently manufacturers are required to stop production periodically for re-calibration. Calibrating the system more frequently gives a bigger process window, but at the cost of more scheduled downtime.

The scanner stability module greatly reduces these production stoppages. Instead, it automatically resets the system to a pre-defined baseline each day. To do this it retrieves standard measurements taken from a monitor wafer using a metrology tool. The monitor wafer is exposed using a special reticle containing special scatterometry marks. From that day's measurements, the scanner stability module determines how far the system has drifted from its baseline. It then calculates wafer-level overlay and focus correction sets. The lithography system then converts these correction sets into specific corrections for each exposure on subsequent production wafers.

Ideally, for volume production, it is desirable to have full flexibility when assigning layers for exposure to a scanner. The alternative, layer-scanner dedication, would put monthly output capacity at risk, since any small disturbance of the lithocluster directly shows up in the output of that month. One known approach to overcome this risk is by so called (overlay) grid matching. All scanner grids are intentionally offset a little, such that all scanners more or less have the same (average) grid for overlay. This grid is often referred to as 'holy' or 'golden' grid. Each product layer can now be exposed on each scanner of the same type. This 'golden' grid is exposed and etched onto so called 'reference wafers'. If these 'golden' matching wafers are used as the baseline for overlay stability control instead of random monitoring wafers, overlay grid matching and long-term stability can be achieved in a single automated step.

Figure 5:
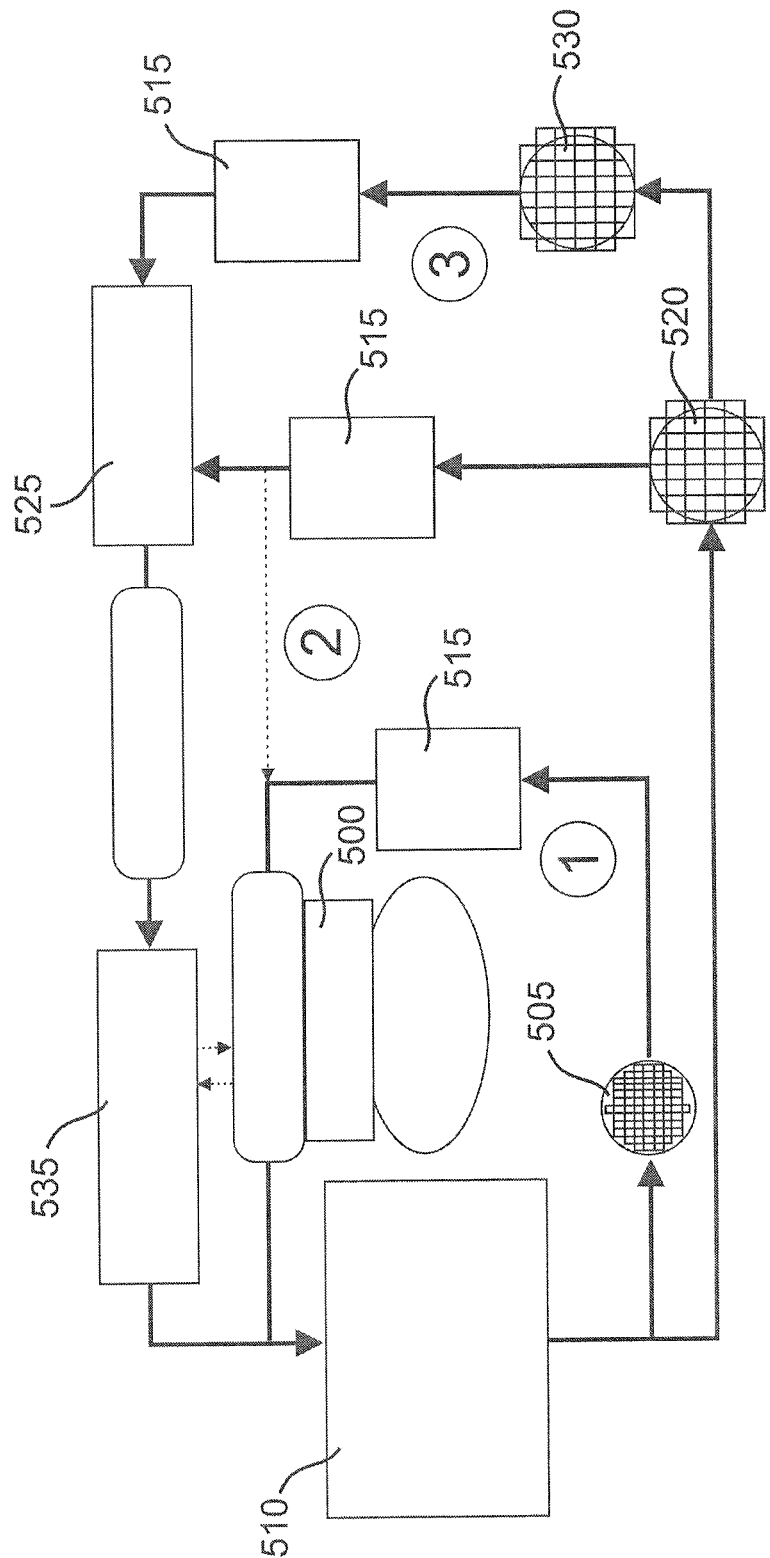
FIG. 5 illustrates control loops in a lithographic process utilizing a scanner stability module.

FIG. 5 depicts the overall lithography and metrology method incorporating the scanner stability module 500 (essentially an application running on a server, in this example). Shown are three main process control loops. The first loop provides the local scanner control using the scanner stability module 500 and monitor wafers. The monitor wafer 505 is shown being passed from the main lithography unit 510, having been exposed to set the baseline parameters for focus and overlay. At a later time, metrology unit 515 reads these baseline parameters, which are then interpreted by the scanner stability module 500 so as to calculate correction routines 550 which are passed to the main lithography unit 510, and used when performing further exposures.

The second Advanced Process Control (APC) loop is for local scanner control on-product (determining focus, dose, and overlay). The exposed product wafer 520 is passed to metrology unit 515 and then onto the Advanced Process Control (APC) module 525. Data from the metrology unit 515 is again passed to the scanner stability module 500. Process corrections 540 are made before the Manufacturing Execution System (MES) 535 takes over, providing scanner control to the main lithography unit 510, in communication with the scanner stability module 500.

The third loop is to allow metrology integration into the second APC loop (e.g., for double patterning). The post etched wafer 530 is passed to metrology unit 515 and then onto the Advanced Process Control (APC) module. The loop continues the same as with the second loop.

Embodiments of the present invention relate to embodiments for estimating model parameters of a lithographic apparatus and controlling exposure by a lithographic apparatus.

The wafer domain is defined to exist on [−1 1], given N measurement points on [−1 1], and discrete Chebyshev polynomials are generated that are discretely orthonormal on [−1 1]. This set of orthonormal polynomials is then utilized as a basis function to model overlay errors across the wafer (field). Other discretely orthogonal basis functions may also be used.

The overlay system is parameterized in a linear state-space form as $$y = Ex$$

where: y are the measured overlay errors, which are measured using an inspection apparatus such as a scatterometer; matrix E is built from the orthonormal polynomial basis functions and the measurement coordinates; and vector x are the states, also known as the model parameters, such as scale, reticle magnification, rotation, etc., which will be inferred via inversion of the above model.

The orthogonality of the basis function assures that the matrix E has limited or no linear dependence. Thus, the parameters of the model are estimated precisely with minimal measurements.

With reference to FIG. 6, an exposure 600 is performed 602 using a lithographic apparatus across a wafer 604. A set of predetermined wafer measurement locations 606 is obtained 608. This sample plan may be optimized by determining where to measure so that the best (most precise) model is achieved. Thus the predetermined substrate measurement locations may be optimized to increase accuracy of the calculated estimated model parameters. Discrete orthogonal polynomials, in this embodiment orthonormal polynomials, are generated 610 using the predetermined substrate measurement locations. These may be generated as described in "Some computational aspects of discrete orthonormal moments", Mukundan, R., IEEE Transactions on Image Processing, Volume 13, Issue 8, August 2004 Page(s): 1055-1059, which is incorporated by reference herein in its entirety. The overlay errors arising from the exposure are measured 612 at the predetermined locations to obtain overlay measurements 614 (y). This step may be performed by the metrology unit 515 shown in FIG. 5. The estimated model parameters 616 (x) of the lithographic apparatus are calculated 618 from the overlay measurements 614 (y) by using the discrete orthogonal polynomials as a basis function to model (D) the overlay across the wafer. Finally, the estimated model parameters 616 (x) are used to control 620 the lithographic apparatus 622 (such as the main lithography unit 510 in FIG. 5) in order to provide corrected overlay across the wafer 624. In one embodiment, embodiments of the present invention may be implemented as a software program running on the scanner stability module 500 shown in FIG. 5, in co-operation with the metrology unit 515 and the main lithography unit 510.

Embodiments of the present invention may provide several advantages. The operation and system can be simple to execute. The order of the polynomial basis function can be increased without introducing linear dependence. The precision of the estimate can be readily calculated.

Using orthogonal polynomials as the basis of the overlay model allows for more precise state estimates. In other words, more information is contained in states.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method comprising:
    performing a lithographic process using a lithographic apparatus across a substrate;
    using predetermined substrate measurement locations to generate discrete orthogonal polynomials;
    measuring a substrate property arising from the lithographic process at locations of the substrate corresponding to the predetermined measurement locations to obtain substrate property measurements;
    calculating estimated model parameters of the lithographic apparatus from the substrate property measurements by using the generated discrete orthogonal polynomials as a basis function to model the substrate property across the substrate; and
    controlling lithographic processing by the lithographic apparatus using the estimated model parameters.

2. The method according to claim 1, wherein the discrete orthogonal polynomials are orthonormal.

3. The method according to claim 1, wherein the discrete orthogonal polynomials comprise discrete Chebyshev polynomials.

4. The method according to claim 1, wherein the calculating estimated model parameters of the lithographic apparatus comprises:
    constructing a matrix using the generated discrete orthogonal polynomials and the predetermined substrate measurement locations; and
    inverting the matrix.

5. The method according to claim 1, wherein the predetermined substrate measurement locations are optimized to increase accuracy of the calculated estimated model parameters.

6. An apparatus for estimating model parameters of a lithographic apparatus used to perform a lithographic process across a substrate, the apparatus comprising a processor configured to:
    use predetermined substrate measurement locations to generate discrete orthogonal polynomials;
    receive substrate property measurements arising from the lithographic process measured at locations of the substrate corresponding to the predetermined measurement locations; and
    calculate estimated model parameters of the lithographic apparatus from the substrate property measurements by using the generated discrete orthogonal polynomials as a basis function to model the substrate property across the substrate.

7. The apparatus according to claim 6, wherein the discrete orthogonal polynomials are orthonormal.

8. The apparatus according to claim 6, wherein the discrete orthogonal polynomials comprise discrete Chebyshev polynomials.

9. The apparatus according to claim 6, wherein the processor is configured to calculate estimated model parameters of the lithographic apparatus by:
    constructing a matrix using the generated discrete orthogonal polynomials and the predetermined substrate measurement locations; and
    inverting the matrix.

10. The apparatus according to claim 6, wherein the processor is configured to generate the predetermined substrate measurement locations such that they are optimized to increase accuracy of the calculated estimated model parameters.

11. An apparatus for controlling lithographic processing by a lithographic apparatus used to perform a lithographic process across a substrate, the apparatus comprising a processor configured to:
    use predetermined substrate measurement locations to generate discrete orthogonal polynomials;
    receive substrate property measurements arising from the lithographic process measured at locations of the substrate corresponding to the predetermined measurement locations;
    calculate estimated model parameters of the lithographic apparatus from the substrate property measurements by using the generated discrete orthogonal polynomials as a basis function to model the substrate property across the substrate; and
    control lithographic processing by the lithographic apparatus using the estimated model parameters.

12. The apparatus according to claim 11, wherein the discrete orthogonal polynomials are orthonormal.

13. The apparatus according to claim 11, wherein the discrete orthogonal polynomials comprise discrete Chebyshev polynomials.

14. The apparatus according to claim 11, wherein the processor is configured to calculate estimated model parameters of the lithographic apparatus by:
    constructing a matrix using, the generated discrete orthogonal polynomials and the predetermined substrate measurement locations; and
    inverting the matrix.

15. The apparatus according to claim 11, wherein the processor is configured to generate the predetermined substrate measurement locations such that they are optimized to increase accuracy of the calculated estimated model parameters.

16. A non-transitory computer readable medium having instructions stored thereon for estimating model parameters of a lithographic apparatus used to perform a lithographic process across a substrate, the instructions when executed by one or more processors, cause the one or more processors to:
    use predetermined substrate measurement locations to generate discrete orthogonal polynomials;
    receive substrate property measurements arising from the lithographic process measured at locations of the substrate corresponding to the predetermined measurement locations; and calculate estimated model parameters of the lithographic apparatus from the substrate property measurements by using the generated discrete orthogonal polynomials as a basis function to model the substrate property across the substrate.

17. A non-transitory computer readable medium having instructions stored thereon for controlling lithographic processing by a lithographic apparatus used to perform a lithographic process across a substrate, the instructions when executed by one or more processors, cause the one or more processors to:
  use predetermined substrate measurement locations to generate discrete orthogonal polynomials;
  receive substrate property measurements arising from the lithographic process measured at locations of the substrate corresponding to the predetermined measurement locations;
  calculate estimated model parameters of the lithographic apparatus from the substrate property measurements by using the generated discrete orthogonal polynomials as a basis function to model the substrate property across the substrate; and
  control lithographic processing by the lithographic apparatus using the estimated model parameters.

* * * * *